US009144881B2

(12) United States Patent
Nakao et al.

(10) Patent No.: US 9,144,881 B2
(45) Date of Patent: Sep. 29, 2015

(54) POLISHING APPARATUS AND POLISHING METHOD

(71) Applicant: EBARA CORPORATION, Tokyo (JP)

(72) Inventors: Hidetaka Nakao, Tokyo (JP); Soichi Isobe, Tokyo (JP); Seiji Katsuoka, Tokyo (JP); Naoki Matsuda, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/187,778

(22) Filed: Feb. 24, 2014

(65) Prior Publication Data

US 2014/0242885 A1  Aug. 28, 2014

(30) Foreign Application Priority Data

Feb. 28, 2013  (JP) ................................. 2013-039506

(51) Int. Cl.
*B24B 37/34* (2012.01)
*H01L 21/67* (2006.01)
*B24B 9/06* (2006.01)

(52) U.S. Cl.
CPC ............... *B24B 37/345* (2013.01); *B24B 9/065* (2013.01); *H01L 21/67046* (2013.01); *H01L 21/67051* (2013.01); *H01L 21/67219* (2013.01)

(58) Field of Classification Search
CPC .... B24B 37/345; B24B 37/04; B24B 41/005; B24B 57/02; B24B 53/017; B24B 53/007; B24B 53/12; B24B 53/00; B24B 53/10
USPC .................. 451/57, 66, 67, 44, 444
See application file for complete search history.

(56) References Cited

U.S. PATENT DOCUMENTS

| | | | | |
|---|---|---|---|---|
| 5,769,695 | A * | 6/1998 | Katayama | 451/298 |
| 5,942,445 | A * | 8/1999 | Kato et al. | 438/691 |
| 6,162,730 | A * | 12/2000 | Kai et al. | 438/690 |
| 6,174,222 | B1 * | 1/2001 | Sato et al. | 451/44 |
| 6,227,950 | B1 * | 5/2001 | Hempel et al. | 451/66 |
| 6,491,836 | B1 * | 12/2002 | Kato et al. | 216/88 |
| 6,530,826 | B2 * | 3/2003 | Wenski et al. | 451/41 |
| 6,994,611 | B2 * | 2/2006 | Svirchevski et al. | 451/56 |
| 7,507,146 | B2 * | 3/2009 | Kato et al. | 451/41 |
| 8,267,741 | B2 * | 9/2012 | Kimura et al. | 451/5 |
| 8,376,811 | B2 * | 2/2013 | Schwandner | 451/41 |
| 8,403,727 | B1 * | 3/2013 | Redeker et al. | 451/57 |
| 8,952,496 | B2 * | 2/2015 | Masuda | 257/618 |
| 2001/0046774 | A1 * | 11/2001 | Sommer | 438/692 |
| 2002/0132566 | A1 * | 9/2002 | Jeong | 451/57 |
| 2003/0022495 | A1 * | 1/2003 | Netsu et al. | 438/689 |

(Continued)

FOREIGN PATENT DOCUMENTS

| | | |
|---|---|---|
| JP | 2002-192446 A | 7/2002 |
| JP | 2008-042220 A | 2/2008 |
| JP | 2010-141218 A | 6/2010 |

*Primary Examiner* — George Nguyen
(74) *Attorney, Agent, or Firm* — Leydig, Voit & Mayer, Ltd.

(57) ABSTRACT

A polishing apparatus includes a peripheral-portion polishing unit configured to polish a peripheral portion of the substrate, a CMP unit configured to polish a flat surface of the substrate W, a cleaning unit configured to clean the polished substrate, a transport system configured to transport the substrate. The transport system transports the substrate that has been polished in one of the peripheral-portion polishing unit and the CMP unit to the cleaning unit, and transports the substrate that has been cleaned in the cleaning unit to the other of the peripheral-portion polishing unit and the CMP unit.

9 Claims, 15 Drawing Sheets

(56) References Cited

U.S. PATENT DOCUMENTS

| | | |
|---|---|---|
| 2003/0082999 A1* | 5/2003 | Yoshikawa et al. ............ 451/41 |
| 2003/0134570 A1* | 7/2003 | Hakomori ........................ 451/5 |
| 2004/0106363 A1 | 6/2004 | Ishii et al. |
| 2004/0248405 A1* | 12/2004 | Fukunaga et al. ............ 438/637 |
| 2006/0042317 A1* | 3/2006 | Miyamoto ........................ 65/61 |
| 2007/0158308 A1* | 7/2007 | Koyata et al. ................... 216/88 |
| 2009/0142992 A1 | 6/2009 | Takahashi et al. |
| 2009/0305612 A1 | 12/2009 | Miyazaki et al. |
| 2010/0130103 A1* | 5/2010 | Nakao et al. .................... 451/28 |
| 2011/0117822 A1* | 5/2011 | Terada et al. ................... 451/41 |
| 2011/0189505 A1* | 8/2011 | Ono et al. ..................... 428/846.9 |
| 2012/0111361 A1* | 5/2012 | Treichel et al. ................... 134/6 |

\* cited by examiner

POLISHING APPARATUS AND POLISHING METHOD

CROSS REFERENCE TO RELATED APPLICATION

This application claims priority to Japanese Patent Application No. 2013-039506 filed Feb. 28, 2013, the entire contents of which are hereby incorporated by reference.

BACKGROUND OF THE INVENTION

1. Field of the Invention

The present invention relates to a polishing apparatus and a polishing method for polishing a substrate, such as a wafer, in which devices are formed, and in particular, relates to a multistage polishing apparatus and a multistage polishing method for polishing a flat surface and a peripheral portion of the substrate.

2. Description of the Related Art

In fabricating processes of semiconductor devices, a surface and a peripheral portion (which is also called a bevel portion or an edge portion) of a wafer are polished in order to remove an unnecessary material film. This wafer polishing process is generally divided into a process of polishing the flat surface of the wafer and a process of polishing the peripheral portion of the wafer. The polishing of the flat surface of the wafer is performed by placing the surface of the wafer in sliding contact with a polishing tool, such as a polishing pad, while supplying a polishing liquid (slurry) onto the polishing tool. Such polishing with use of the slurry is called Chemical Mechanical Polishing (CMP). The polishing of the peripheral portion of the wafer is performed by placing a polishing tape in sliding contact with the peripheral portion of the wafer while supplying a polishing liquid (typically pure water) onto the wafer.

As disclosed in Japanese patent publication No. 4655369, Japanese laid-open patent publication No. 2010-141218, and Japanese laid-open patent publication No. 2008-42220, several multistage polishing methods for polishing the flat surface of the wafer and further polishing the peripheral portion of the wafer are proposed. However, in such multistage polishing methods, polishing debris produced in a previous polishing process and/or slurry may adversely influence a subsequent polishing process. For example, the polishing debris may cause scratches on the wafer.

SUMMARY OF THE INVENTION

Embodiments of the present invention provide a polishing apparatus and a polishing method which can perform multistage polishing without causing defects, such as scratches, to a substrate, such as a wafer.

An embodiment is a polishing apparatus for polishing a substrate, including: a peripheral-portion polishing unit configured to polish a peripheral portion of the substrate; a CMP unit configured to polish a flat surface of the substrate; a cleaning unit configured to clean the polished substrate; and a transport system configured to transport the substrate. The transport system is operable to transport the substrate that has been polished in one of the peripheral-portion polishing unit and the CMP unit to the cleaning unit, and transport the substrate that has been cleaned in the cleaning unit to the other of the peripheral-portion polishing unit and the CMP unit.

The transport system may be operable to transport the substrate that has been polished in the other of the peripheral-portion polishing unit and the CMP unit to the cleaning unit.

The polishing apparatus may further include an inverting device configured to invert the substrate. The inverting device is disposed between the peripheral-portion polishing unit and the CMP unit.

The polishing apparatus may further include a drying unit configured to dry the substrate that has been cleaned in the cleaning unit.

The cleaning unit may include a first cleaning unit configured to clean the substrate that has been polished in the peripheral-portion polishing unit, and a second cleaning unit configured to clean the substrate that has been polished in the CMP unit.

Another embodiment is a polishing method of polishing a substrate, including: performing a first polishing process of polishing the substrate; cleaning the substrate after the first polishing process; and performing a second polishing process of polishing the cleaned substrate, wherein the first polishing process is a process of polishing one of a flat surface and a peripheral portion of the substrate, and wherein the second polishing process is a process of polishing the other of the flat surface and the peripheral portion of the substrate.

The polishing method may further include cleaning the substrate after the second polishing process.

The polishing method may further include cleaning the substrate after the second polishing process and then drying the substrate.

Cleaning the substrate after the first polishing process and cleaning the substrate after the second polishing process may be performed in different cleaning units.

According to the above embodiments, the substrate is cleaned after the first polishing process is performed, and then the second polishing process is performed. Therefore, the polishing debris produced in the first polishing process and/or the slurry used in the first polishing process can be removed from the substrate, and therefore the occurrence of the defects, such as scratches, is prevented in the second polishing process.

DETAILED DESCRIPTION

Figure 1A:
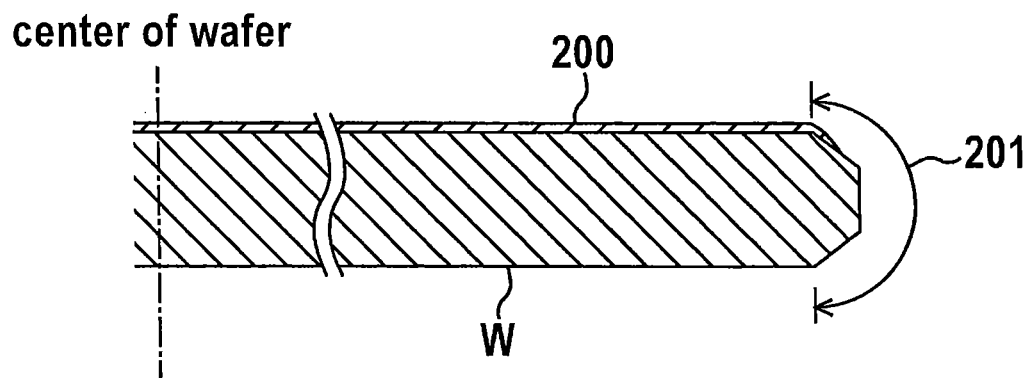
FIG. 1A and FIG. 1B are views each showing an enlarged cross-sectional view of a wafer as an example of a substrate.
Figure 1B:
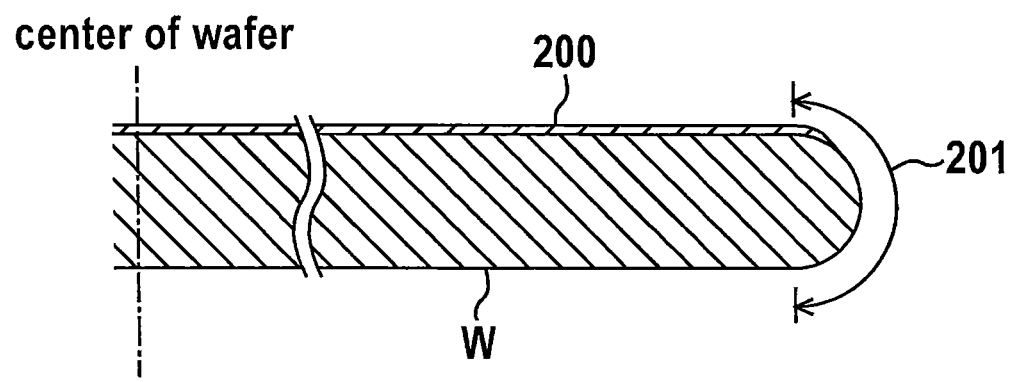

Embodiments will be described below with reference to the drawings. FIG. 1A and FIG. 1B are enlarged cross-sectional views each showing a wafer as an example of a substrate. More specifically, FIG. 1A is a cross-sectional view of a so-called straight type wafer, and FIG. 1B is a cross-sectional view of a so-called round type wafer. A structure 200 composed of a multilayer film (e.g., device) or a single-layer film is formed on a surface of the wafer W. A peripheral portion 201 of the wafer is an outermost peripheral surface of the wafer W. This peripheral portion 201 is also called a bevel portion or an edge portion.

Figure 2:
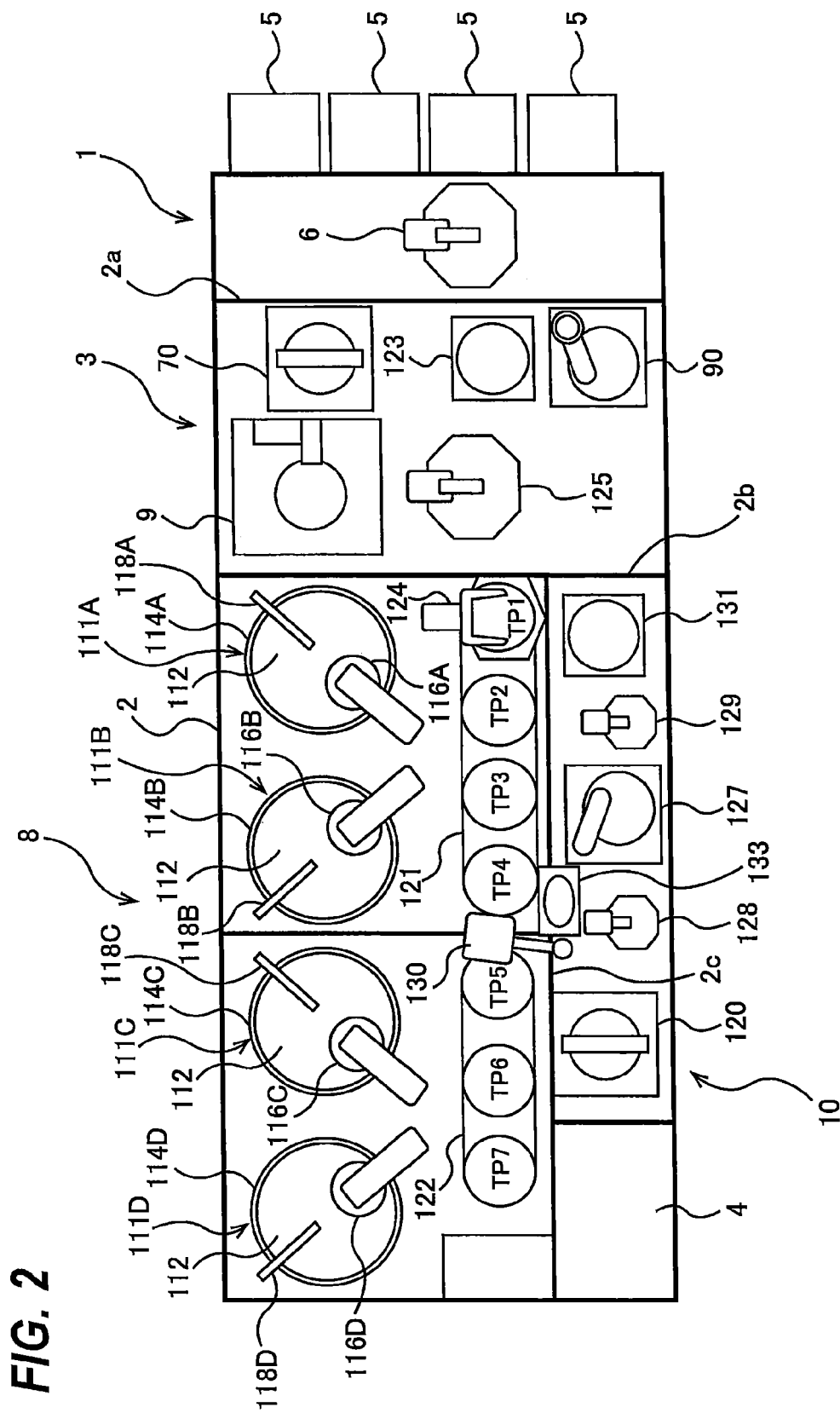
FIG. 2 is a plan view showing a polishing apparatus according to an embodiment.

FIG. 2 is a plan view showing a polishing apparatus according to an embodiment. This polishing apparatus is a multi-stage polishing apparatus capable of performing a series of processes of multistage polishing, cleaning, and drying of the wafer. As shown in FIG. 2, the polishing apparatus has a housing 2 in an approximately rectangular shape. An interior of the housing 2 is divided by partition walls 2a, 2b, and 2c into a loading and unloading section 1, a peripheral-portion polishing section 3, a CMP section 8, and a cleaning section 10. The polishing apparatus has an operation controller 4 for controlling processing operations. The loading and unloading section 1, the peripheral-portion polishing section 3, and the CMP section 8 are arranged in series in this order. The peripheral-portion polishing section 3 is disposed between the loading and unloading section 1 and the CMP section 8.

The loading and unloading section 1 includes a plurality of load ports 5 for receiving thereon wafer cassettes each storing a plurality of wafers (substrates) therein. In this loading and unloading section 1, a loader (transfer robot) 6, which can move along the load ports 5, is disposed. The loader 6 can access the wafers in the wafer cassettes received on the load ports 5.

The peripheral-portion polishing section 3 is a region in which the peripheral portion of the wafer is polished. This peripheral-portion polishing section 3 includes a peripheral-portion polishing unit 9 for polishing the peripheral portion of the wafer, a first cleaning unit 70 for cleaning upper and lower surfaces of the wafer, a drying unit 90 for drying the wafer, a first temporary placement stage 123 on which the wafer is temporarily placed, and a first transfer robot 125 for transferring the wafer between these units 9, 70, and 90 and the first temporary placement stage 123.

Figure 3:
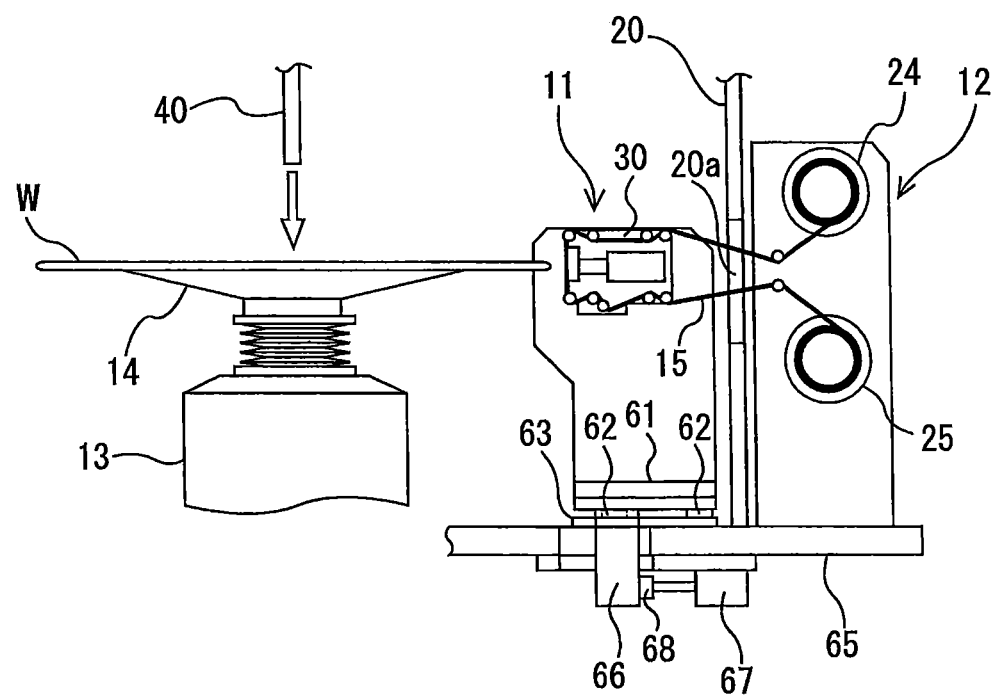
FIG. 3 is a schematic view showing an example of a peripheral-portion polishing unit.
Figure 4:
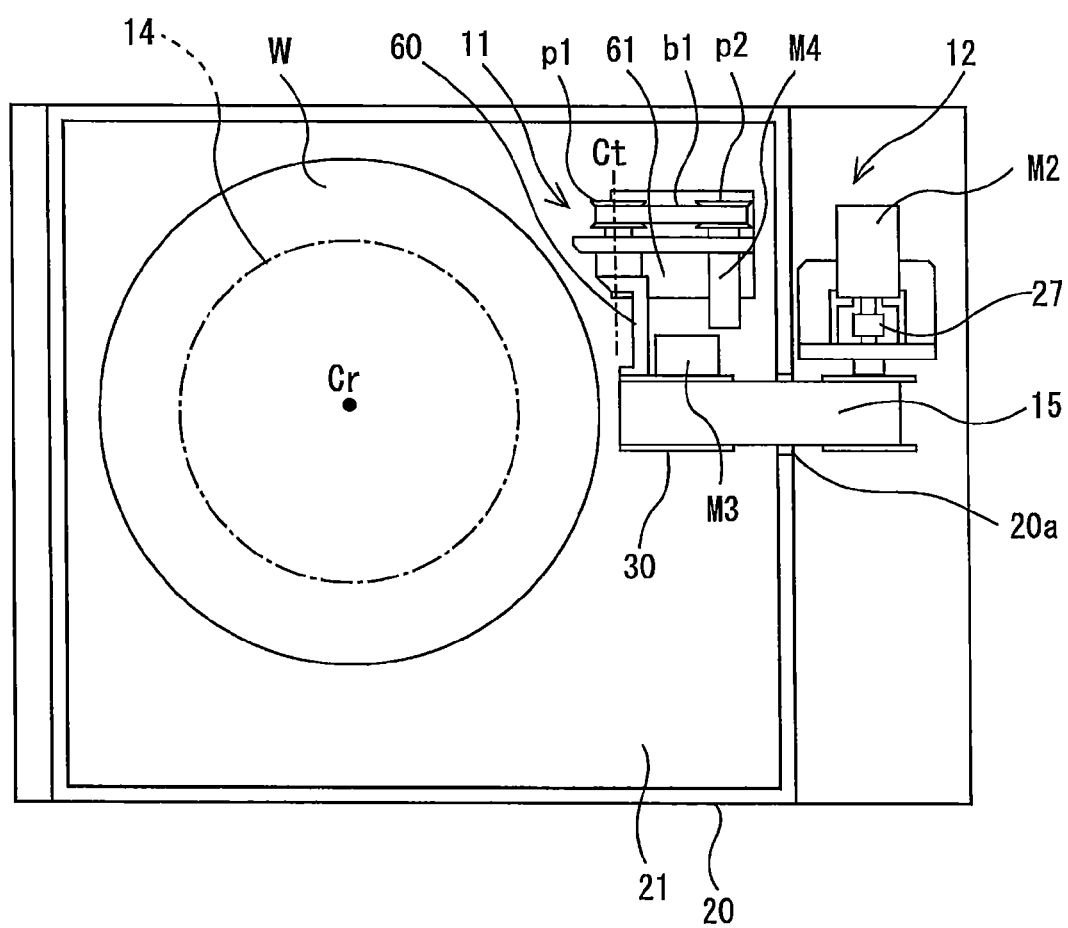
FIG. 4 is a plan view of the peripheral-portion polishing unit.

FIG. 3 is a schematic view showing an example of the peripheral-portion polishing unit 9, and FIG. 4 is a plan view of the peripheral-portion polishing unit 9 shown in FIG. 3. This peripheral-portion polishing unit 9 includes a substrate holder 13 for holding a wafer W horizontally and rotating the wafer W. The substrate holder 13 includes a holding stage 14 for holding the wafer W by vacuum suction, and a motor (not shown) for rotating the holding stage 14.

A polishing head assembly 11 is disposed near the peripheral portion of the wafer W held by the substrate holder 13. A polishing-tape supply mechanism 12 is provided at a back side of the polishing head assembly 11. The polishing head assembly 11 and the polishing-tape supply mechanism 12 are isolated by a partition wall 20. An interior space of the partition wall 20 provides a polishing chamber 21. The polishing head assembly 11 and the holding stage 14 are disposed in the polishing chamber 21, while the polishing-tape supply mechanism 12 is disposed outside the partition wall 20 (i.e., outside the polishing chamber 21).

The polishing-tape supply mechanism 12 includes a supply reel 24 for supplying a polishing tape 15 to the polishing head assembly 11, and a take-up reel 25 for taking up the polishing tape 15 that has been used in polishing of the wafer W. Motors M2 are coupled to the supply reel 24 and the take-up reel 25 via couplings 27, respectively (FIG. 4 shows only the coupling 27 and the motor M2 coupled to the supply reel 24). These motors M2 are configured to exert a predetermined tension on the polishing tape 15.

The polishing head assembly 11 includes a polishing head 30 for pressing the polishing tape 15, supplied from the polishing-tape supply mechanism 12, against the peripheral portion of the wafer W. The polishing tape 15 has a polishing surface to which abrasive grains are fixed. The polishing tape 15 is supported by the polishing head 30 such that the polishing surface of the polishing tape 15 faces the wafer W. The polishing tape 15 is supplied to the polishing head 30 from the supply reel 24 through an opening 20a formed in the partition wall 20, and the polishing tape 15 that has been used in polishing of the wafer is taken up by the take-up reel 25 through the opening 20a. A polishing water supply nozzle 40 is disposed above the substrate holder 13. This polishing water supply nozzle 40 is configured to supply pure water as polishing water onto the center of the wafer W.

Figure 5:
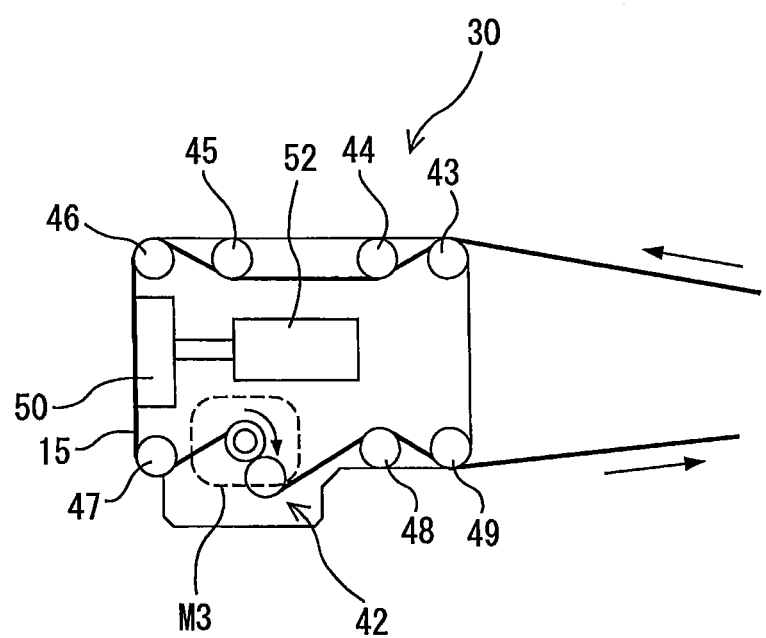
FIG. 5 is an enlarged view of a polishing head.

FIG. 5 is an enlarged view of the polishing head 30. This polishing head 30 includes a tape-advancing mechanism 42 for advancing the polishing tape 15 from the supply reel 24 to the take-up reel 25. This tape-advancing mechanism 42 has two rollers for sandwiching the polishing tape 15 therebetween and is constructed to advance the polishing tape 15 in a longitudinal direction thereof by rotating one of the two rollers by a motor M3. Further, the polishing head 30 has a plurality of guide rollers 43, 44, 45, 46, 47, 48, and 49, and these guide rollers are arranged so as to guide the polishing tape 15 in such a way that the polishing tape 15 is advanced in a direction perpendicular to a tangential direction of the wafer W.

The polishing head 30 further includes a back pad (a pressure pad) 50 which is disposed at a back side of the polishing tape 15, and a pneumatic cylinder (an actuator) 52 for moving the back pad 50 toward the wafer W. A pressure of pressing the polishing tape 15 against the wafer W is controlled by an air pressure supplied to the pneumatic cylinder 52.

As shown in FIG. 4, the polishing head 30 is secured to one end of an arm 60, which is rotatable about an axis Ct extending parallel to the tangential direction of the wafer W. The other end of the arm 60 is coupled to a motor M4 via pulleys p1 and p2 and a belt b1. As the motor M4 rotates in a clockwise direction and a counterclockwise direction through a certain angle, the arm 60 rotates about the axis Ct through a certain angle. In this embodiment, the motor M4, the arm 60, the pulleys p1 and p2, and the belt b1 constitute a tilting mechanism for tilting the polishing head 30 with respect to the surface of the wafer W. This tilting mechanism is configured to rotate the polishing head 30 through a certain angle about a polishing point (i.e., a contact point between the polishing tape 15 and the wafer W) so that a contact angle between the polishing tape 15 and the wafer W can be changed.

The polishing head 30 is coupled to a movable base 61 via the tilting mechanism. The movable base 61 is movably coupled to a base plate 65 via guides 62 and rails 63. The rails 63 extend linearly in the radial direction of the wafer W held on the substrate holder 13, so that the movable base 61 can move linearly in the radial direction of the wafer W. A connection plate 66, extending through the base plate 65, is secured to the movable base 61. A linear actuator 67 is coupled to the connection plate 66 via a joint 68. The linear actuator 67 is secured to the base plate 65 directly or indirectly. The linear actuator 67 may comprise a pneumatic cylinder or a combination of a positioning motor and a ball screw.

The linear actuator 67, the rails 63, and the guides 62 constitute a polishing head moving mechanism for linearly moving the polishing head 30 in the radial direction of the wafer W. Specifically, the polishing head moving mechanism is operable to move the polishing head 30 closer to and away from the wafer W along the rails 63. The polishing-tape supply mechanism 12 is fixed to the base plate 65.

Figure 6A:
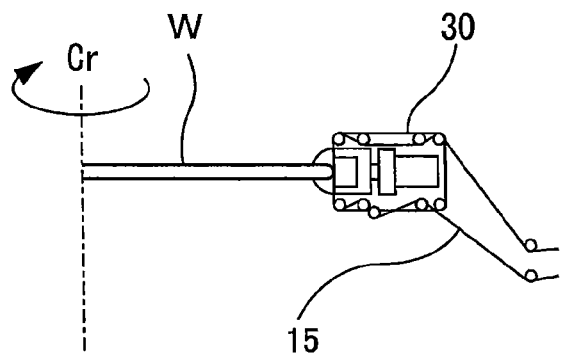
FIG. 6A, FIG. 6B, and FIG. 6C are views each showing a state in which a polishing tape is pressed against a peripheral portion of the wafer while a tilting mechanism is changing an angle of the polishing head.
Figure 6B:
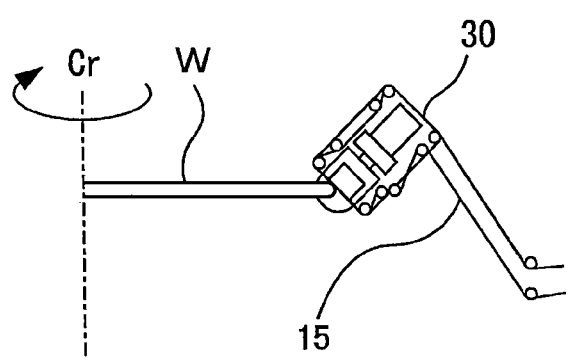
Figure 6C:
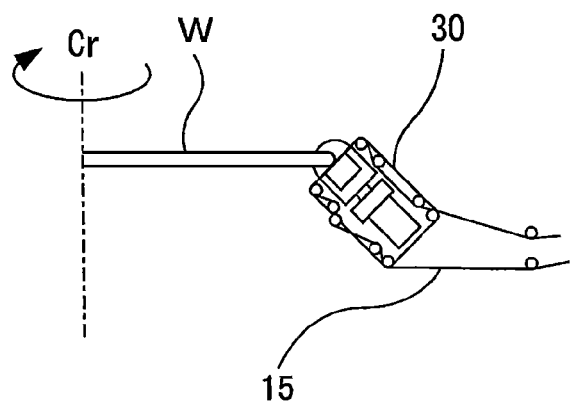

Polishing of the peripheral portion of the wafer W is performed as follows. The wafer W is rotated about its axis by the substrate holder 13, and the pure water as the polishing water is supplied onto the center portion of the wafer W from the polishing water supply nozzle 40. In this state, the polishing tape 15 is pressed against the peripheral portion of the wafer W by the polishing head 30. The peripheral portion of the wafer W is polished by sliding contact with the polishing tape 15. As shown in FIGS. 6A to 6C, the tilting mechanism may change an angle of the polishing head 30, while the polishing tape 15 is pressing against the peripheral portion of the wafer W.

Figure 7:
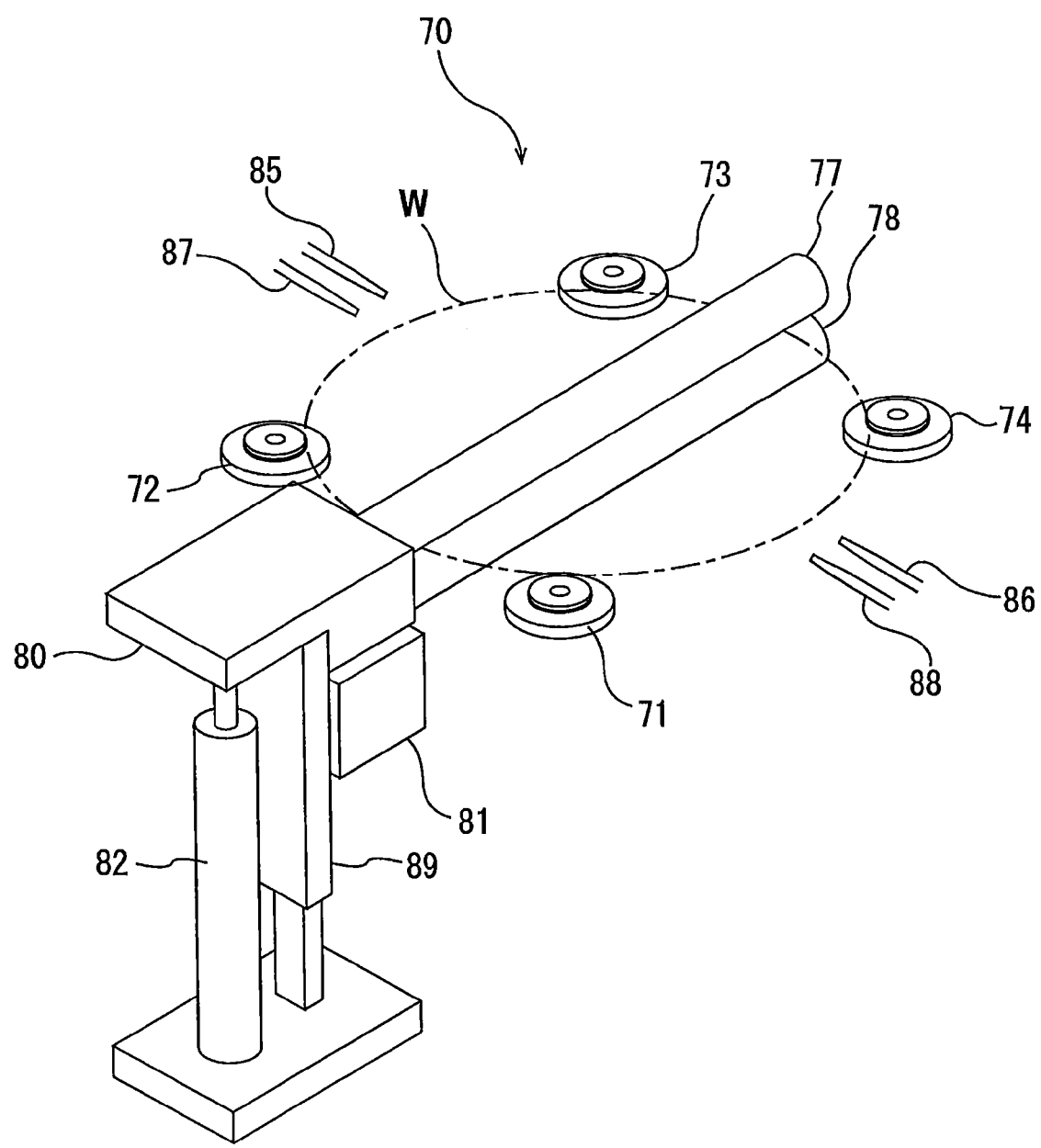
FIG. 7 is a perspective view showing a first cleaning unit.

FIG. 7 is a perspective view showing the first cleaning unit 70. As shown in FIG. 7, the first cleaning unit 70 includes four holding rollers 71, 72, 73, and 74 for holding and rotating the wafer W, roll sponges (i.e., cleaning tools) 77, 78 which are brought into contact with the upper and lower surfaces of the wafer W, respectively, rotating devices 80, 81 for rotating these roll sponges 77, 78, respectively, pure water supply nozzles 85, 86 for supplying pure water onto the upper and lower surfaces of the wafer W, and chemical liquid supply nozzles 87, 88 for supplying chemical liquid onto the upper and lower surfaces of the wafer W. The holding rollers 71, 72, 73, and 74 can be moved in directions closer to and away from the wafer W by driving devices (e.g., pneumatic cylinders) which are not shown in FIG. 7.

The rotating device 80 for rotating the upper roll sponge 77 is secured to a guide rail 89 which guides a movement of the rotating device 80 in a vertical direction. Further, this rotating device 80 is supported by an elevating device 82, which moves the rotating device 80 and the upper roll sponge 77 in the vertical direction. Although not shown, the rotating device 81 for rotating the lower roll sponge 78 is also supported by a guide rail, and the rotating device 81 and the lower roll sponge 78 can be moved in the vertical direction by an elevating device. A motor drive mechanism using a ball screw or a pneumatic cylinder may be used as the elevating device. When the wafer W is cleaned, the roll sponges 77, 78 are moved closer to each other to contact the upper and lower surfaces of the wafer W.

Cleaning of the wafer W is performed as follows. The wafer W is held by the holding rollers 71, 72, 73, and 74, and is then rotated. Next, the chemical liquid is supplied onto the upper and lower surfaces of the wafer W from the chemical liquid supply nozzles 87, 88. In this state, the roll sponges 77, 78 are rotated about their axes extending in the horizontal direction, and are placed in sliding contact with the upper and lower surfaces of the wafer W to thereby scrub the upper and lower surfaces of the wafer W. After scrubbing, the roll sponges 77, 78 are moved upward and downward, respectively, and the pure water is supplied onto the upper surface and the lower surface from the pure water supply nozzles 85, 86, respectively, to thereby rinse the upper and lower surfaces of the wafer W.

Figure 8:
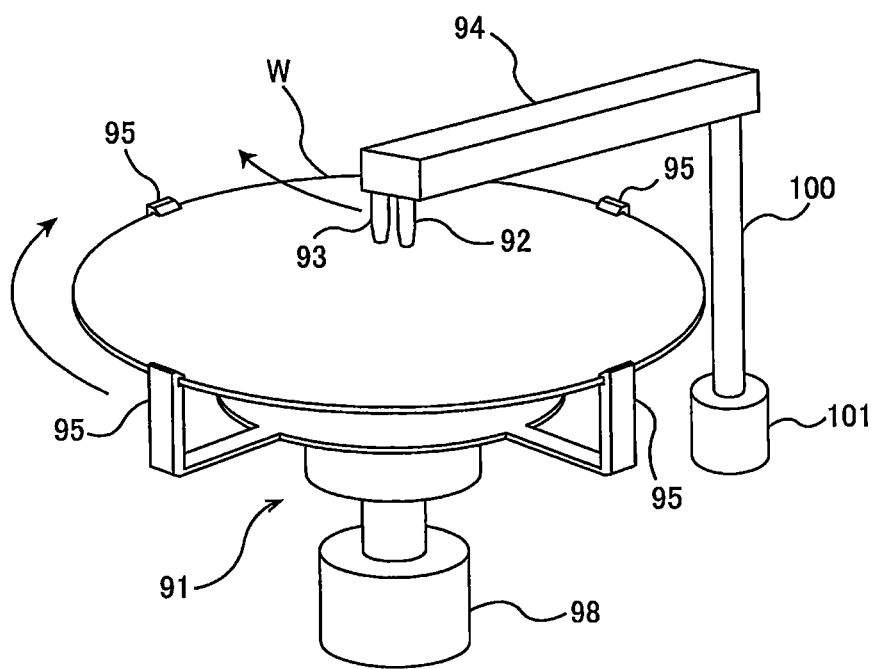
FIG. 8 is a perspective view showing a drying unit.

FIG. 8 is a perspective view showing the drying unit 90. The drying unit 90 includes a substrate holding device 91 for holding and rotating the wafer W, an IPA nozzle 92 and a pure water nozzle 93, and an arm 94 holding the IPA nozzle 92 and the pure water nozzle 93. The IPA nozzle 92 is provided for supplying IPA vapor (i.e., a mixture of nitrogen gas and isopropyl alcohol) to the surface of the wafer W, and the pure water nozzle 93 is provided for supplying pure water to the surface of the wafer W for preventing the surface of the wafer W from being dried. The IPA nozzle 92 and the pure water nozzle 93 are constructed so as to be capable of moving along the radial direction of the wafer W.

The substrate holding device 91 includes a plurality of chucks 95 (four chucks in FIG. 8) for holding the peripheral portion of the wafer W. The wafer W is horizontally held by these chucks 95. A motor 98 is coupled to the chucks 95, so that the wafer W, held by the chucks 95, is rotated about its axis by the motor 98.

The arm 94 is disposed above the wafer W. The pure water nozzle 93 and the IPA nozzle 92 are disposed adjacent to each other at one end of the arm 94, and a pivot shaft 100 is coupled to the other end of the arm 94. A motor 101 as an arm rotating device for causing the arm 94 to pivot is coupled to this pivot shaft 100. The arm rotating device may have reduction gears in addition to the motor 101. The motor 101 is configured to rotate the pivot shaft 100 through a certain angle to thereby rotate the arm 94 in a plane in parallel with the wafer W. Therefore, as the arm 94 pivots, the pure water nozzle 93 and the IPA nozzle 92 fixed to this arm 94 move outwardly in the radial direction of the wafer W.

Figure 9:
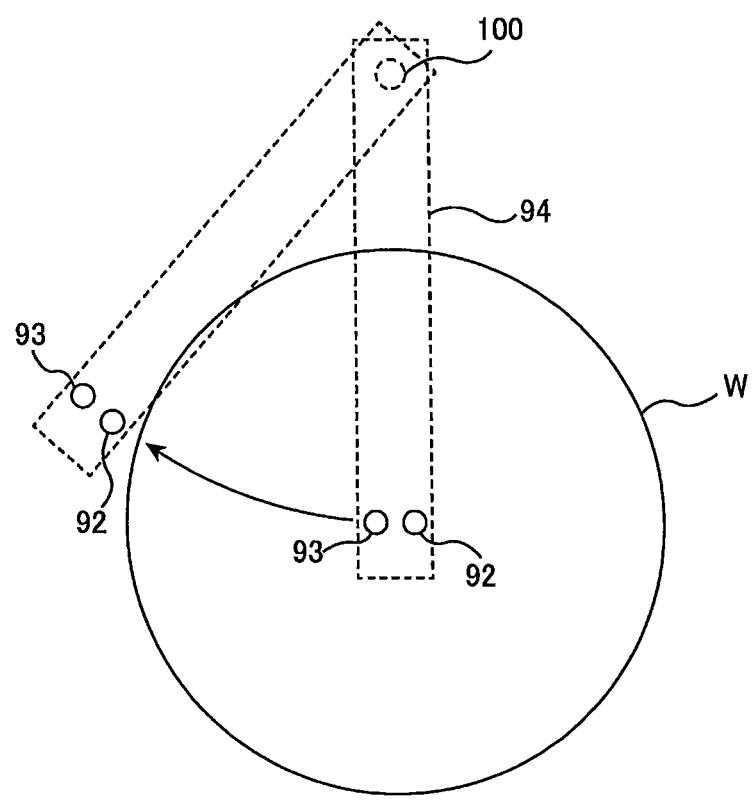
FIG. 9 is a plan view showing a manner of moving a pure water nozzle and an IPA nozzle outwardly from a center of the wafer in a radial direction of the wafer.

Drying of the wafer W is performed as follows. The wafer W is rotated by the substrate holding device 91, and the pure water nozzle 93 and the IPA nozzle 92 are moved to a position above the center of the wafer W. Subsequently, as shown in FIG. 9, the pure water nozzle 93 and the IPA nozzle 92 are moved along the radial direction of the wafer W from the center to the outside of the wafer W, while the pure water nozzle 93 and the WA nozzle 92 supply the IPA vapor and the pure water to the surface of the wafer W. The pure water nozzle 93 is located forward of the IPA nozzle 92. Therefore, the IPA nozzle 92 is moved so as to follow the pure water nozzle 93 in the same path as the pure water nozzle 93. In this manner, the surface of the wafer W is dried. Thereafter, the wafer W is rotated at a high speed, so that the pure water, attached to a back surface of the wafer W, is removed. During the high rotation of the wafer W, dry gas may be supplied to the back surface of the wafer W from a gas nozzle (not shown).

The above-described drying unit 90 is a dryer in which IPA is used. However, other type of drier may be used. For example, a spin-dry type drier in which the wafer is rotated at a high speed may be used.

The CMP section 8 is a region in which the flat surface of the wafer (hereinafter simply referred to as "surface") is chemically and mechanically polished. This CMP section 8 includes a first CMP unit 111A, a second CMP unit 111B, a third CMP unit 111C, and a fourth CMP unit 111D. The first CMP unit 111A includes a first polishing table 114A to which a polishing pad 112 having a polishing surface is attached, a first top ring 116A for holding the wafer and pressing the wafer against the polishing pad 112 on the first polishing table 114A, and a first polishing liquid supply nozzle 118A for supplying polishing liquid (slurry) onto the polishing pad 112.

Similarly, the second CMP unit 111B includes a second polishing table 114B to which a polishing pad 112 is attached, a second top ring 116B, and a second polishing liquid supply nozzle 118B. The third CMP unit 111C includes a third polishing table 114C to which a polishing pad 112 is attached, a third top ring 116C, and a third polishing liquid supply nozzle 118C. The fourth CMP unit 111D includes a fourth polishing table 114D to which a polishing pad 112 is attached, a fourth top ring 116D, and a fourth polishing liquid supply nozzle 118D.

A first linear transporter 121 is disposed adjacent to the first CMP unit 111A and the second CMP unit 111B. This first linear transporter 121 is a device for transporting the wafer between four transfer positions, i.e., a first transfer position TP1, a second transfer position TP2, a third transfer position TP3, and a fourth transfer position TP4. A second linear transporter 122 is disposed adjacent to the third CMP unit 111C and the fourth CMP unit 111D. This second linear transporter 122 is a device for transporting the wafer between three transfer positions, i.e., a fifth transfer position TP5, a sixth transfer position TP6, and a seventh transfer position TP7.

An inverting device 124 for receiving the wafer from the loader 6 is disposed adjacent to the first transfer position TP1. The wafer is transported from the loader 6 to the first linear transporter 121 via this inverting device 124. A shutter (not shown) is provided on the partition wall 2b at a position between the inverting device 124 and the loader 6. When the wafer is to be transported, the shutter is opened to thereby allow the loader 6 to transport the wafer to the inverting device 124.

The wafer is inverted by the inverting device 124 such that the surface to be polished faces down. The inverted wafer is transported from the inverting device 124 to the first linear transporter 121 and is transported to the first CMP unit 111A and the second CMP unit 111B by the first linear transporter 121. The top ring 116A of the first CMP unit 111A is movable between a position above the first polishing table 114A and the second transfer position TP2 by a swing motion of the top ring 116A. Therefore, the transfer of the wafer to the top ring 116A is performed at the second transfer position TP2.

Similarly, the top ring 116B of the second CMP unit 111B is movable between a position above the polishing table 114B and the third transfer position TP3. The transfer of the wafer to the top ring 116B is performed at the third transfer position TP3. The top ring 116C of the third CMP unit 111C is movable between a position above the polishing table 114C and the sixth transfer position TP6. The transfer of the wafer to the top ring 116C is performed at the sixth transfer position TP6. The top ring 116D of the fourth CMP unit 111D is movable between a position above the polishing table 114D and the seventh transfer position TP7. The transfer of the wafer to the top ring 116D is performed at the seventh transfer position TP7.

A swing transporter 130 is disposed between the first linear transporter 121, the second linear transporter 122, and the cleaning section 10. The wafer is transported from the first linear transporter 121 to the second linear transporter 122 by the swing transporter 130. The wafer is transported to the third CMP unit 111C and/or the fourth CMP unit 111D by the second linear transporter 122.

A buffer station 133 installed on a frame (not shown) is disposed laterally of the swing transporter 130. This buffer station 133 is disposed adjacent to the first linear transporter 121 and located between the first linear transporter 121 and the cleaning section 10. The swing transporter 130 transports the wafer between the fourth transfer position TP4, the fifth transfer position TP5, and the buffer station 133.

Figure 10:
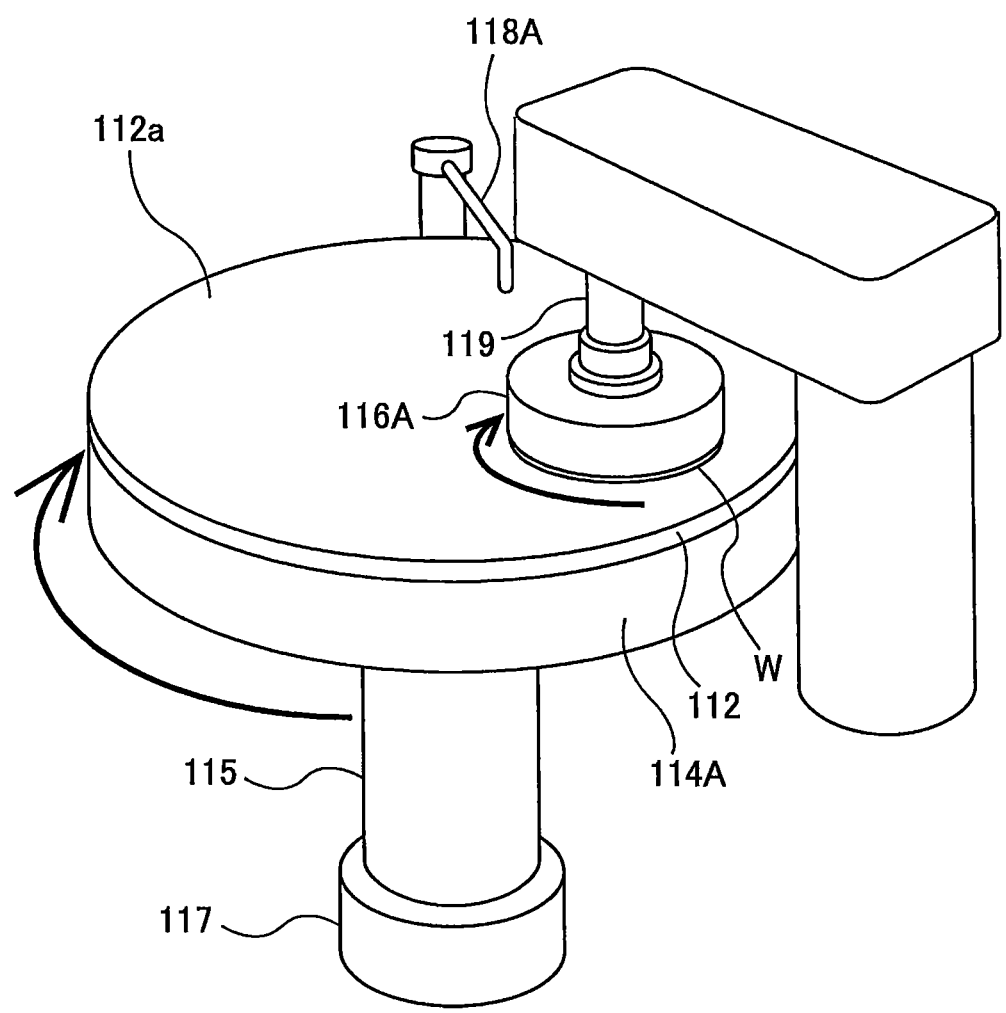
FIG. 10 is a perspective view showing a first CMP unit.

The first CMP unit 111A, the second CMP unit 111B, the third CMP unit 111C, and the fourth CMP unit 111D have the same structure. Therefore, the first CMP unit 111A will be explained below. FIG. 10 is a perspective view showing the first CMP unit 111A. As shown in FIG. 10, the first CMP unit 111A includes the polishing table 114A supporting the polishing pad 112, the top ring 116A for pressing the wafer W against the polishing pad 112, and the polishing liquid supply nozzle 118A for supplying polishing liquid (slurry) onto the polishing pad 112.

The polishing table 114A is coupled through a table shaft 115 to a table motor 117 disposed below the polishing table 114A, and the polishing table 114A is rotated by the table motor 117 in a direction indicated by arrow. The polishing pad 112 is attached to an upper surface of the polishing table 114A, and the upper surface of the polishing pad 112 provides a polishing surface 112a for polishing the wafer W. The top ring 116A is fixed to a lower end of a top ring shaft 119. The top ring 116A is constructed so as to be capable of holding the wafer W on a lower surface thereof by vacuum suction.

Polishing of the surface of the wafer W is performed as follows. The top ring 116A and the polishing table 114A are respectively rotated in directions indicated by arrows, while the polishing liquid (slurry) is supplied onto the polishing pad 112 from the polishing liquid supply nozzle 118A. In this state, the top ring 116A presses the wafer W against the polishing surface 112a of the polishing pad 112. The surface of the wafer W is polished by a mechanical action of abrasive grains contained in the polishing liquid and a chemical action of a chemical component contained in the polishing liquid.

As shown in FIG. 2, a second cleaning unit 120, a third cleaning unit 127, and a second temporary placement stage 131 are disposed adjacent to the CMP units 111A to 111D. A second transfer robot 128 is disposed between the second cleaning unit 120 and the third cleaning unit 127, and a third transfer robot 129 is disposed between the third cleaning unit 127 and the second temporary placement stage 131. The second cleaning unit 120, the second transfer robot 128, the third cleaning unit 127, and the second temporary placement stage 131 are arranged in series in this order. The second cleaning unit 120 has the same structure as the first cleaning unit 70. Therefore, the explanation of the second cleaning unit 120 is omitted.

Figure 11:
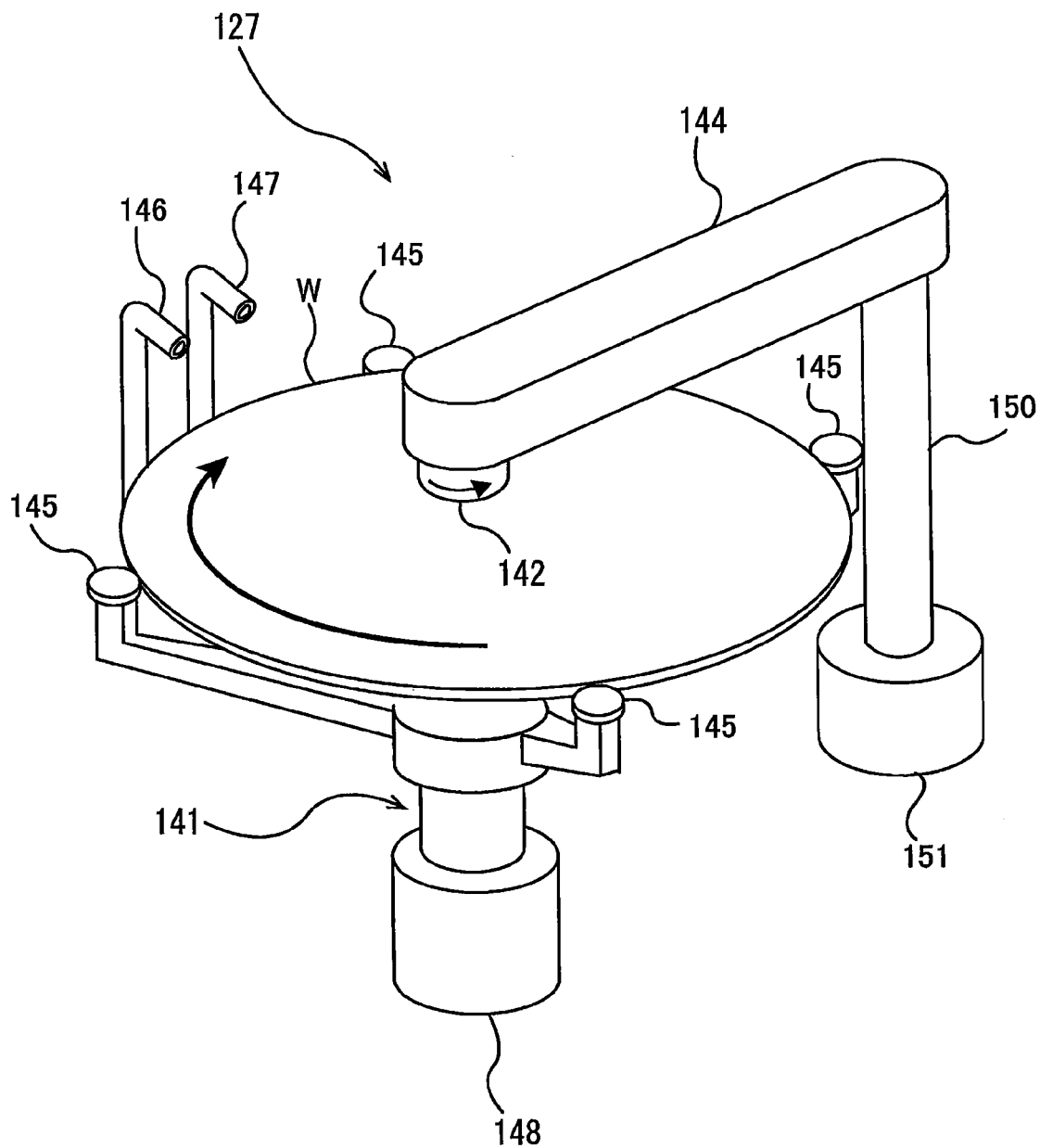
FIG. 11 is a perspective view showing a third cleaning unit.

The third cleaning unit 127 may be a pen-sponge type cleaning machine or a two-fluid-jet cleaning machine. FIG. 11 is a perspective view showing the third cleaning unit 127 of the pen-sponge type. As shown in FIG. 11, this third cleaning unit 127 includes a substrate holding device 141 for holding and rotating the wafer W, a pen sponge 142, an arm 144 holding the pen sponge 142, a pure water supply nozzle 146 for supplying pure water onto the upper surface of the wafer W, and a chemical liquid supply nozzle 147 for supplying cleaning liquid (chemical liquid) onto the upper surface of the wafer W. The pen sponge 142 is coupled to a rotating device (not shown) disposed in the arm 144, so that the pen sponge 142 is rotated about its central axis extending in a vertical direction.

The substrate holding device 141 includes a plurality of chucks 145 (four chucks in FIG. 11) for holding the peripheral portion of the wafer W. The wafer W is horizontally held by these chucks 145. A motor 148 is coupled to the chucks 145, and the wafer W, held by the chucks 145, is rotated about its axis by the motor 148.

The arm 144 is disposed above the wafer W. The pen sponge 142 is coupled to one end of the arm 144, and a pivot shaft 150 is coupled to the other end of the arm 144. A motor 151 as an arm rotating device for rotating the arm 144 is coupled to this pivot shaft 150. The arm rotating device may have reduction gears in addition to the motor 151. The motor 151 is configured to rotate the pivot shaft 150 through a certain angle to thereby rotate the arm 144 in a plane in parallel with the wafer W. Therefore, as the arm 144 pivots, the pen sponge 142, supported by the arm 144, moves outwardly in the radial direction of the wafer W.

Cleaning of the wafer W is performed as follows. First, the wafer W is rotated about its axis. The cleaning liquid is then supplied onto the upper surface of the wafer W from the chemical liquid supply nozzle 147. In this state, the pen sponge 142 is brought into sliding contact with the upper surface of the wafer W while rotating about its axis extending in the vertical direction, and further the pen sponge 142 oscillates in the radial direction of the wafer W. The wafer W is scrubbed by the pen-sponge 142 that is placed in sliding contact with the upper surface of the wafer W in the presence of the cleaning liquid. After scrubbing, the pure water is supplied onto the wafer W from the pure water supply nozzle 146 to thereby rinse the wafer W.

As described above, the two-fluid-jet cleaning machine may be used as the third cleaning unit 127. The two-fluid-jet cleaning machine is configured to produce a mixture of an $N_2$ gas and pure water (DIW) containing a small amount of $CO_2$ gas (carbon dioxide gas) dissolved therein, and eject the mixture of the $N_2$ gas and the pure water onto the surface of the wafer. This type of cleaning machine can remove fine particles on the wafer by fine droplets and impact energy. In particular, wafer cleaning with no damage can be realized by appropriately adjusting a flow rate of the $N_2$ gas and a flow rate of the pure water. Further, use of the pure water containing the carbon dioxide gas therein can prevent corrosion of the wafer that could be caused by static electricity.

The second transfer robot 128 is operable to transport the wafer (polished wafer) placed on the buffer station 133 to the second cleaning unit 120, and further to transport the wafer, cleaned by the second cleaning unit 120, to the third cleaning unit 127. The third transfer robot 129 is operable to transport the wafer, cleaned by the third cleaning unit 127, to the second temporary placement stage 131.

The above-described first transfer robot 125, the second transfer robot 128, the third transfer robot 129, the first linear transporter 121, the second linear transporter 122, and the swing transporter 130 constitute a transport system for transporting the wafer W. The operations of this transport system and the above-described respective units are controlled by the operation controller 4.

Figure 12:
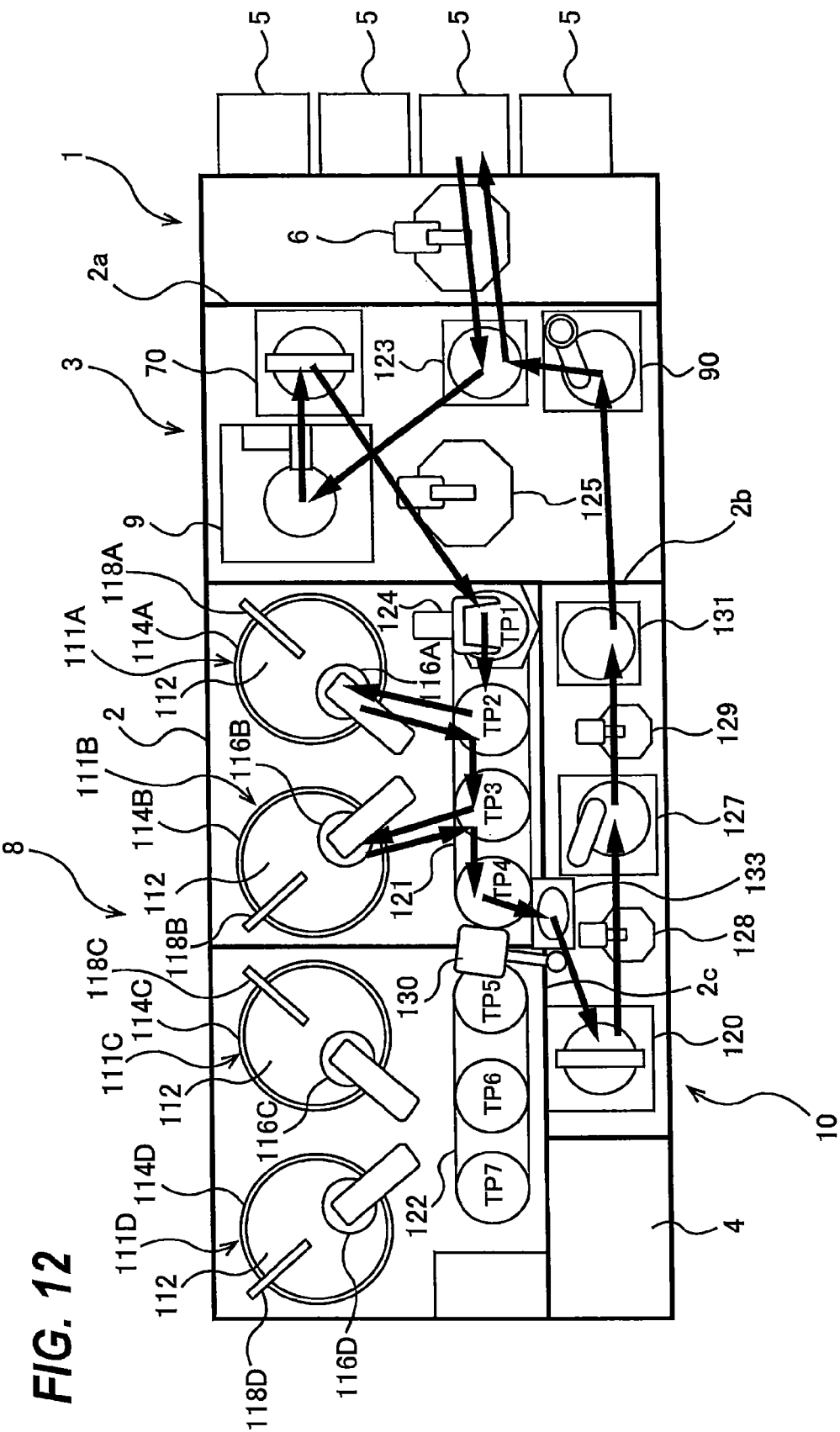
FIG. 12 is a view showing a wafer transport route indicating a polishing method according to one embodiment.

Next, one embodiment of a method of polishing the wafer (substrate) using the above-described polishing apparatus will be explained with reference to FIG. 12. FIG. 12 is a view showing a wafer transport route indicating a polishing method according to one embodiment. The loader 6 removes a wafer from the wafer cassette, and places the wafer on the first temporary placement stage 123. The first transfer robot 125 transports the wafer from the first temporary placement stage 123 to the peripheral-portion polishing unit 9. The peripheral-portion polishing unit 9 polishes the peripheral portion of the wafer according to the above-described polishing operation. The polished wafer is transported by the first transfer robot 125 to the first cleaning unit 70, where the wafer is cleaned. The cleaned wafer is removed from the first cleaning unit 70 by the first transfer robot 125, and is transported to the inverting device 124.

The inverting device 124 inverts the wafer such that the surface on which the structure, such as a device, is formed faces down. The first linear transporter 121 receives the inverted wafer, and transports the wafer to the second transfer position TP2. The first top ring 116A of the first CMP unit 111A holds the wafer on its lower surface, and transports the wafer to the position above the first polishing table 114A. The top ring 116A then presses the wafer against the polishing pad 112 on the rotating first polishing table 114A to polish the surface (flat surface) of the wafer W. The polished wafer is transported from the second transfer position TP2 to the third transfer position TP3 by the first linear transporter 121, and the surface of the wafer W is polished by the second CMP unit 111B in the same manner.

The wafer that has been polished by the peripheral portion polishing unit 9, the first CMP unit 111A, and the second CMP unit 111B is placed on the buffer station 133 by the swing transporter 130. The wafer is further transported from the buffer station 133 to the second cleaning unit 120 by the second transfer robot 128, and the wafer is cleaned by the second cleaning unit 120.

The cleaned wafer is removed from the second cleaning unit 120 by the second transfer robot 128, and is transported to the third cleaning unit 127. The wafer is further cleaned by the third cleaning unit 127. The cleaned wafer is removed from the third cleaning unit 127 by the third transfer robot 129, and is placed on the second temporary placement stage 131. The wafer is further transported to the drying unit 90 by the first transfer robot 125, and the wafer is dried in the drying unit 90. The dried wafer is removed from the drying unit 90 by the first transfer robot 125, and is placed on the first temporary placement stage 123. The wafer is then transported from the first temporary placement stage 123 to the wafer cassette by the loader 6. In this manner, the polishing of the peripheral portion of the wafer (first polishing process), the primary cleaning process, the polishing of the flat surface of the wafer (second polishing process), the secondary cleaning process, the tertiary cleaning process, and the drying process are performed in this order.

Figure 13:
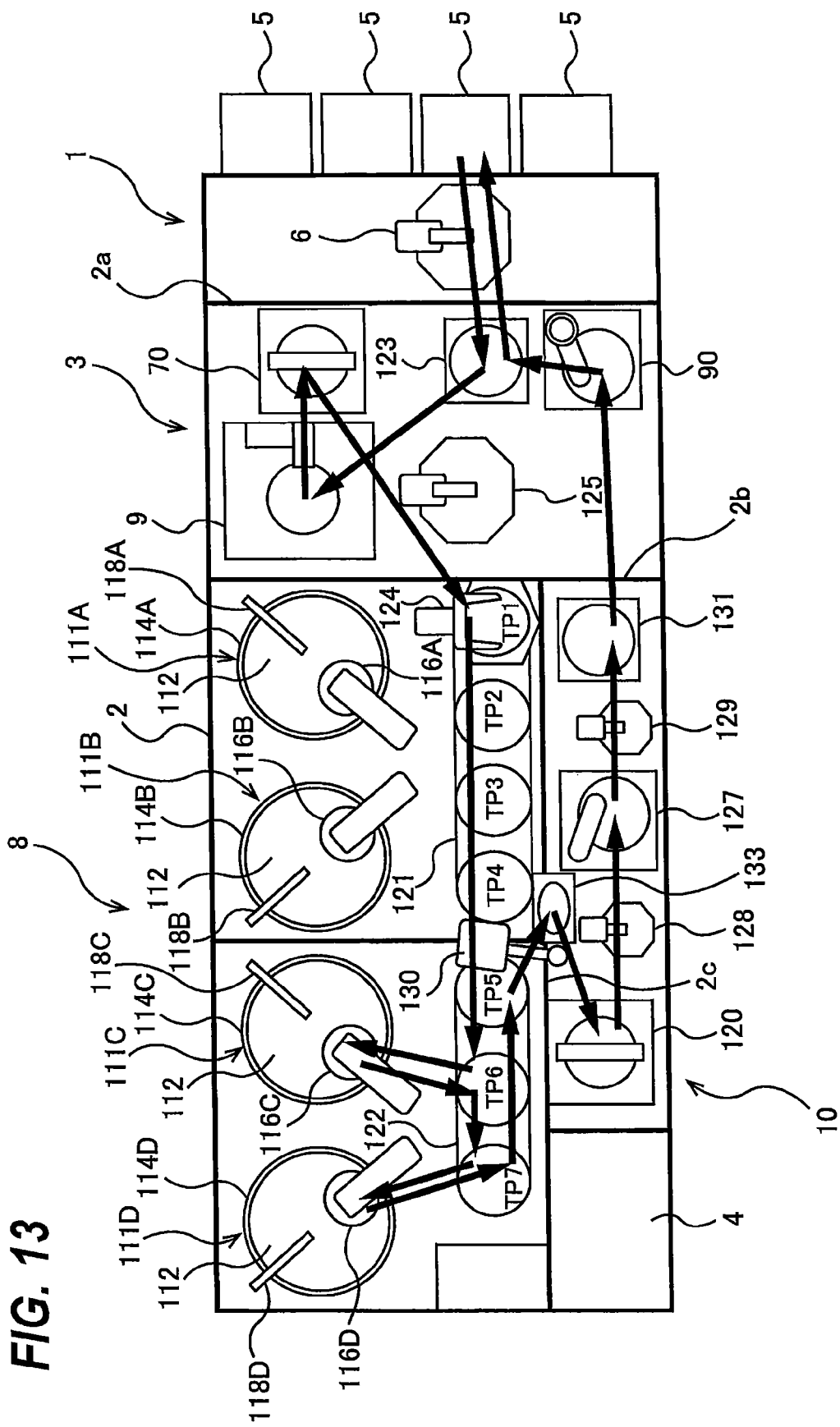
FIG. 13 is a view showing a wafer transport route indicating a polishing method according to an alternative embodiment.

FIG. 13 is a view showing a wafer transport route indicating a polishing method according to an alternative embodiment. This embodiment is different from the previous embodiment shown in FIG. 12 in that the wafer is polished by the third CMP unit 111C and the fourth CMP unit 111D. Specifically, the wafer, whose peripheral portion has been polished, is transported to the fourth transfer position TP4 by the first linear transporter 121, is transported to the second linear transporter 122 by the swing transporter 130, and is further transported to the third CMP unit 111C and the fourth CMP unit 111D in this order so that the flat surface of the wafer is polished successively. The polished wafer is cleaned and dried in the same manner as the previous embodiment shown in FIG. 12.

Figure 14:
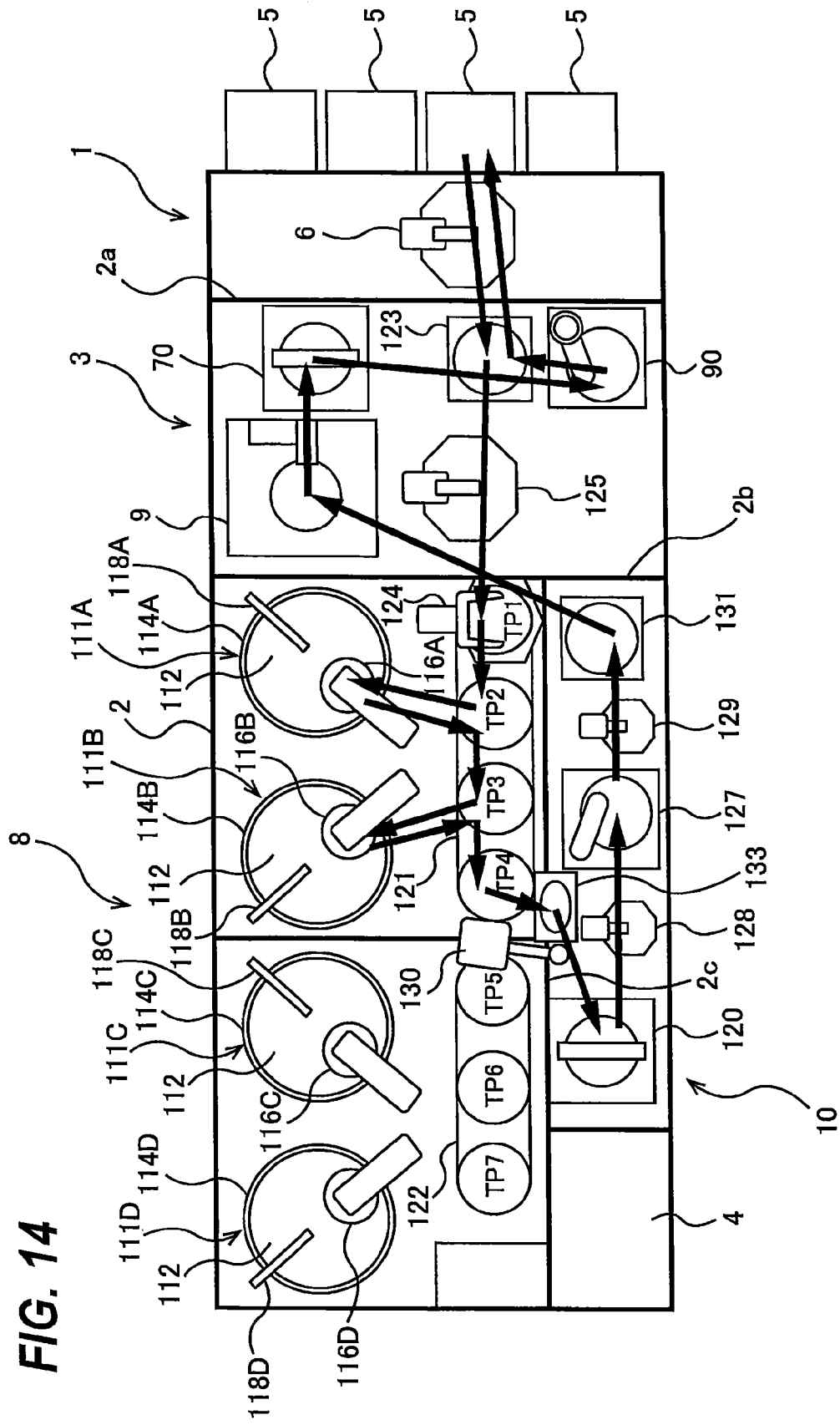
FIG. 14 is a view showing a wafer transport route indicating a polishing method according to an alternative embodiment.

FIG. 14 is a view showing a wafer transport route indicating a polishing method according to an alternative embodiment. The loader 6 removes a wafer from the wafer cassette, and then places the wafer on the first temporary placement stage 123. The first transfer robot 125 removes the wafer from the first temporary placement stage 123, and transports the wafer to the inverting device 124.

The inverting device 124 inverts the wafer such that the surface on which the structure, such as a device, is formed faces down. The inverted wafer is polished by the first CMP unit 111A and the second CMP unit 111B successively in the same manner as the previous embodiment shown in FIG. 12. The wafer, polished by the first CMP unit 111A and the second CMP unit 111B, is placed on the buffer station 133 by the swing transporter 130. The wafer is transported from the buffer station 133 to the second cleaning unit 120 by the second transfer robot 128, and the wafer is cleaned by the second cleaning unit 120.

The cleaned wafer is removed from the second cleaning unit 120 by the second transfer robot 128, and is transported to the third cleaning unit 127. The wafer is further cleaned by the third cleaning unit 127. The cleaned wafer is removed from the third cleaning unit 127 by the third transfer robot 129, and is placed on the second temporary placement stage 131. The wafer is further transported to the peripheral-portion polishing unit 9 by the first transfer robot 125.

The peripheral-portion polishing unit 9 polishes the peripheral portion of the wafer according to the above-described polishing operation. The polished wafer is transported to the first cleaning unit 70 by the first transfer robot 125, and the wafer is cleaned by the first cleaning unit 70. The cleaned wafer is removed from the first cleaning unit 70 by the first transfer robot 125, and is transported to the drying unit 90. The wafer is dried by the drying unit 90. The dried wafer is removed from the drying unit 90 by the first transfer robot 125, and is placed on the first temporary placement stage 123. The wafer is further transported from the first temporary placement stage 123 to the wafer cassette by the loader 6. In this manner, the polishing of the flat surface of the wafer (first polishing process), the primary cleaning process, the secondary cleaning process, the polishing of the peripheral portion of the wafer (second polishing process), the tertiary cleaning process, and the drying process are performed in this order.

Figure 15:
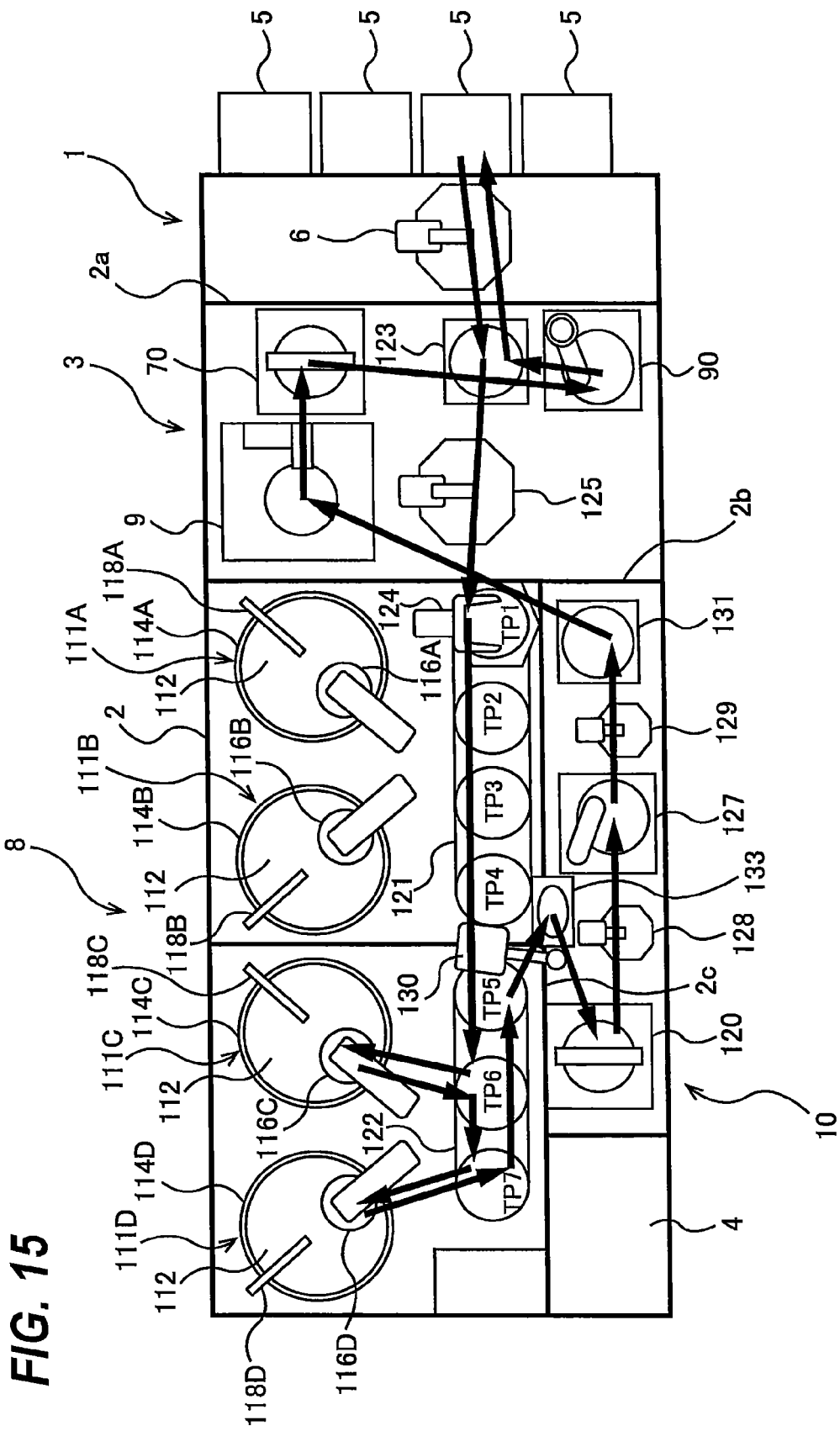
FIG. 15 is a view showing a wafer transport route indicating a polishing method according to an alternative embodiment.

FIG. 15 is a view showing a wafer transport route indicating a polishing method according to an alternative embodiment. This embodiment is different from the previous embodiment shown in FIG. 14 in that the wafer is polished by the third CMP unit 111C and the fourth CMP unit 111D. Specifically, the wafer is transported to the fourth transfer position TP4 by the first linear transporter 121, is transported to the second linear transporter 122 by the swing transporter 130, and is further transported to the third CMP unit 111C and the fourth CMP unit 111D in this order so that the flat surface of the wafer is polished successively. As with the previous embodiment shown in FIG. 14, the polished wafer is transported to the cleaning section 10, and is cleaned by the second cleaning unit 120 and the third cleaning unit 127. Further, the peripheral portion of the wafer is polished by the peripheral-portion polishing unit 9, and then the wafer is cleaned and dried.

According to a certain of the above-described embodiments, the wafer is cleaned after the first polishing process is performed, and then the second polishing process is performed. Therefore, the polishing debris produced in the first polishing process and/or the slurry used in the first polishing process can be removed from the wafer, and as a result, the defects, such as scratches, can be prevented in the second polishing process.

According to a certain of the above-described embodiments, two-step CMP is performed with use of two of the four CMP units 111A to 111D. The transport route of the wafer can be appropriately changed. For example, the wafer may be transported to the first CMP unit 111A and the third CMP unit 111C in this order, or the wafer may be transported to the second CMP unit 111B and the third CMP unit 111C in this order.

Four-step CMP may be performed with use of all of the four CMP units 111A to 111D. For example, the wafer may be transported to the CMP units 111A to 111D in this order so that the wafer W is polished successively. The wafer may be transported to any one of the four CMP units 111A to 111D. For example, the wafer may be transported to only the first CMP unit 111A so that one-step CMP is performed. Further, three-step CMP may be performed with use of three of the four CMP units 111A to 111D. For example, the wafer may be transported to the first CMP unit 111A, the second CMP unit 111B, and the third CMP unit 111C in this order, or the wafer may be transported to the first CMP unit 111A, the third CMP unit 111C, and the fourth CMP unit 111D in this order. The wafer may be transported in a transport route in which only CMP or only peripheral-portion polishing is performed.

While the peripheral-portion polishing unit 9 uses the polishing tape to polish the peripheral portion of the wafer in the above-described embodiments, the peripheral-portion polishing unit 9 may use, instead of the polishing tape, a grindstone to polish the peripheral portion of the wafer.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A polishing apparatus for polishing a substrate, comprising:
    a peripheral-portion polishing unit configured to polish a peripheral portion of the substrate;
    a CMP unit configured to polish a flat surface of the substrate;
    a cleaning unit configured to clean the polished substrate; and
    a transport system configured to transport the substrate,
    the transport system being operable to transport the substrate that has been polished in one of the peripheral-portion polishing unit and the CMP unit to the cleaning unit, and transport the substrate that has been cleaned in the cleaning unit to one of the peripheral-portion polishing unit and the CMP unit, wherein if the substrate has been polished in the peripheral-portion polishing unit the transport system being operable to transport the substrate from the cleaning unit to the CMP unit and if the substrate has been polished in the CMP unit the transport system being operable to transport the substrate from the cleaning unit to the peripheral-portion polishing unit.

2. The polishing apparatus according to claim 1, wherein the transport system is operable to transport the substrate that has been polished in both the peripheral-portion polishing unit and the CMP unit to the cleaning unit.

3. The polishing apparatus according to claim 1, further comprising an inverting device configured to invert the substrate, the inverting device being disposed between the peripheral-portion polishing unit and the CMP unit.

4. The polishing apparatus according to claim 1, further comprising a drying unit configured to dry the substrate that has been cleaned in the cleaning unit.

5. The polishing apparatus according to claim 1, wherein the cleaning unit comprises a first cleaning unit configured to clean the substrate that has been polished in the peripheral-portion polishing unit, and a second cleaning unit configured to clean the substrate that has been polished in the CMP unit.

6. The polishing apparatus according to claim 1, wherein the CMP unit comprises:
    a polishing table to which a polishing pad is to be attached;
    a top ring for pressing the substrate against the polishing pad; and a polishing liquid supply nozzle for supplying a polishing liquid onto the polishing pad.

7. The polishing apparatus according to claim 1, wherein the peripheral-portion polishing unit comprises:
a substrate holder for holding the substrate; and
a polishing head assembly for pressing a polishing tool against the substrate.

8. The polishing apparatus according to claim 7, wherein the polishing tool comprises a polishing tape.

9. The polishing apparatus according to claim 7, wherein the polishing tool comprises a grindstone.

* * * * *